United States Patent
Rajan et al.

(10) Patent No.: US 7,203,393 B2
(45) Date of Patent: Apr. 10, 2007

(54) MEMS MICRO MIRRORS DRIVEN BY ELECTRODES FABRICATED ON ANOTHER SUBSTRATE

(75) Inventors: Narayanan Rajan, Atlanta, GA (US); Chien Hung Wu, Parma Heights, OH (US); Jay S. Mitchell, Atlanta, GA (US); Lucy Huang, Solon, OH (US)

(73) Assignee: Movaz Networks, Inc., Norcross, GA (US)

( * ) Notice: Subject to any disclaimer, the term of this patent is extended or adjusted under 35 U.S.C. 154(b) by 0 days.

(21) Appl. No.: 10/290,745

(22) Filed: Nov. 7, 2002

(65) Prior Publication Data

US 2003/0169962 A1     Sep. 11, 2003

Related U.S. Application Data

(60) Provisional application No. 60/362,898, filed on Mar. 8, 2002.

(51) Int. Cl.
*G02B 6/35* (2006.01)

(52) U.S. Cl. .......................................... 385/18; 385/16

(58) Field of Classification Search ............ 385/16–24
See application file for complete search history.

(56) References Cited

U.S. PATENT DOCUMENTS

| | | | | |
|---|---|---|---|---|
| 6,470,110 | B1 * | 10/2002 | Lin .............................. | 385/18 |
| 6,922,499 | B2 * | 7/2005 | Boie et al. ..................... | 385/18 |
| 2001/0017726 | A1 * | 8/2001 | Hara et al. ................... | 359/223 |
| 2002/0117728 | A1 * | 8/2002 | Brosnihhan et al. ........ | 257/446 |
| 2005/0152637 | A1 * | 7/2005 | Walter et al. ................. | 385/16 |

* cited by examiner

*Primary Examiner*—Sarah Song
(74) *Attorney, Agent, or Firm*—Charles S. Guenzer (57) ABSTRACT

An array of electrostatically tiltable mirrors are formed in a MEMS structure. A first SOI wafer is etched to form an array of tiltable plates in the silicon device layer joined to the remainder of the wafer through pairs of torsion beams. A second SOI wafer is etched to form cavities corresponding to the tiltable plates. A ceramic multi-chip module (MCM) carrier is formed with multiple layers of wiring and electrodes corresponding to the tiltable plates. The two SOI wafers including their handle layers are bonded together. The handle layer of the second SOI is removed, and the bonded wafers are diced into chips. Each chip is bonded to a respective MCM carrier. Thereafter, the handle layer of the first SOI wafer is removed to release the tiltable mirror plates and the torsion beams. Electronic control chips may be bonded to the MCM carrier.

26 Claims, 5 Drawing Sheets

MEMS MICRO MIRRORS DRIVEN BY ELECTRODES FABRICATED ON ANOTHER SUBSTRATE

RELATED APPLICATIONS

This application claims benefit of U.S. Provisional Application 60/362,898 filed Mar. 8, 2002 and is related to U.S. application, Ser. No. 10/290,743, concurrently filed on Nov. 7, 2002 and now abandoned. Both these applications are incorporated herein by reference in their entireties.

BACKGROUND OF THE INVENTION

1. Field of the Invention

The invention relates generally to micro electromechanical systems (MEMS). In particular, the invention relates to a method of fabricating an array of tiltable MEMS micro mirrors.

2. Background Art

The technology of micro electromechanical systems (MEMS) has received increasing attention in recent years as it has demonstrated that mechanical systems and their electrical actuators can be effectively and economically combined on a microscopic scale much smaller than that typical in traditional mechanical systems assembled from machined parts. MEMS devices are typically fabricated from silicon wafers or other silicon-based substrates using techniques well developed in the integrated circuit industry. These techniques include photolithography, etching, sputtering, and chemical vapor deposition, for all of which 1 µm resolution is readily available.

A MEMS device is advantageously implemented as an optical switch in an optical communication system based upon optical fiber communications links, as has been described by Smith et al. in U.S. patent application Ser. No. 09/957,312, filed Sep. 20, 2001 and now issued as U.S. Pat. No. 6,798,941, incorporated herein by reference in its entirety. Solgaard et al. disclose an earlier version of such a device in U.S. Pat. No. 6,097,859. Such a MEMS device 10 appropriate for the present invention is illustrated schematically in plan view in FIG. 1. It may include an array of tiltable micromirrors 12 formed in a substrate 14 and arranged in a 2-dimensional array. A gimbal structure allows each of a large number of mirrors 12 to tilt in one direction about an axis of a first pair of torsion beams 16 integrally joining the mirror 12 to substrate 14 and to tilt in an orthogonal direction about an orthogonal axis of a second pair of similar torsion beams 18. The mirrors 12 are separately and independently tiltable by electrical actuators included within the MEMS. Typically, opposed electrodes in the mirror 12 and substrate 14 allow independent electrostatic actuation about the respective axes for the respective mirrors 12.

Figure 1:
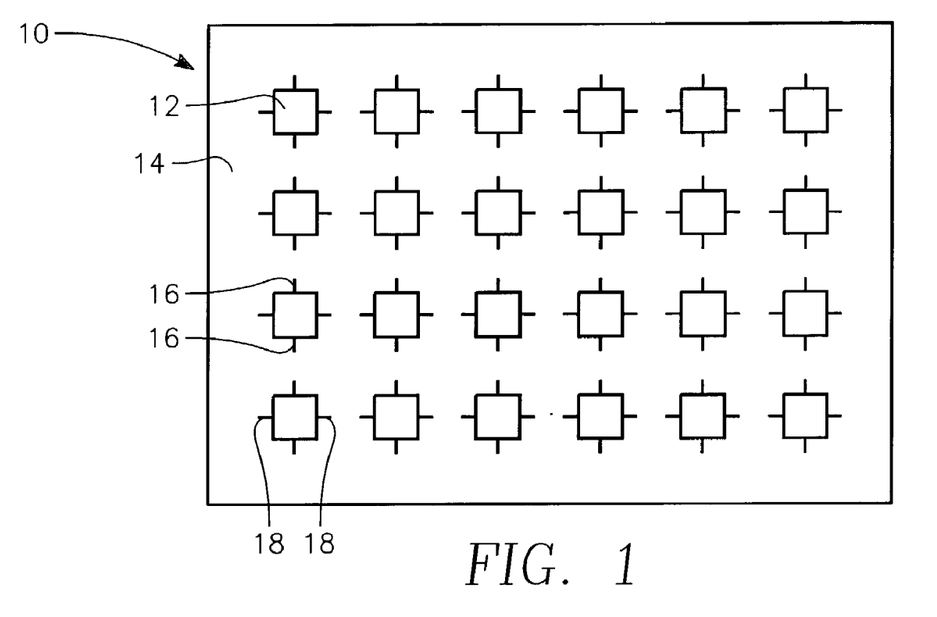
FIG. 1 is a plan view of a micro electromechanical (MEMS) micro mirror array.

In a wavelength division multiplexing (WDM) communication systems in which optical carriers of different wavelengths are impressed on the optical fiber link and the switch selectively connects wavelength-separated signals between the fibers, one direction in the array may correspond to wavelength and the other to the fiber. In this case, there may be 80 or more WDM wavelengths and 6 or more input and output fibers. Further, the number of mirrors in the fiber direction is often doubled since two fibers may be linked via two mirrors through a coupling mirror. That is, there may be up to a thousand or more of such tiltable mirrors 12 formed in a single substrate 10 having dimensions of only a few centimeters. One baseline design includes 80×12=960 mirrors in a two-dimensional array spaced at 470 µm in the wavelength direction and 750 µm in the fiber direction. A similar micro mirror array may be used in white-light communication systems although the number of mirrors corresponds generally to the number of fiber so that the number, while significant, is typically much less than in a WDM system.

MEMS arrays on the level of integration contemplated here present challenges in integrating the MEMS structures with the electrical circuitry controlling and driving the electrical actuators. While wire bonding external circuitry to the MEMS structure is feasible for a few actuators on the order of about a hundred, it becomes problematic for the large arrays described above. The wire bonding is time consuming, and the large bonding pads occupy too much space. Furthermore, if the electrical interconnects linking bonding pads to the actuators are formed on the same surface as the mirrors, the fill factor of total mirror area to chip area further decreases.

Garverick et al. have proposed a multiplexed electrostatic actuator system in U.S. patent application Ser. No. 09/884,676, filed Jun. 19, 2001, now issued as U.S. Pat. No. 6,543,286, and published as PCT Application WO 02/060045 A2, incorporated herein by reference in their entireties. The multiplexing allows relatively few, for example, less than 30, electrical lines to control the entire micro mirror array. However, each actuator still requires its own high-voltage drive line. Furthermore, the multiplexing requires the overall system to also include both low-voltage digital control circuitry of moderate complexity and some high-voltage circuitry to directly drive the electrostatic electrodes.

In U.S. patent application, Ser. No. 10/120,869, filed Apr. 11, 2002, now issued as U.S. Pat. No. 6,694,073, and incorporated herein by reference in its entirety and in International Publication No. WO 02/1084372 A2, Golub et al. have disclosed a free-space optical system that may be based on such an array of MEMS mirrors. The optical design is simplified if the overall extent of the mirror array is minimized while the area of each mirror is maximized, that is, a MEMS mirror array with a high fill factor on the MEMS substrate.

The design of the MEMS micro mirrors can be improved. The mirror itself is subject to countervailing requirements. It should be relatively stiff so that it is not subject to warping and flexing. Mirror deformation should be controlled to less than $\lambda/8$, which corresponds to approximately 0.19 µm for the wavelengths of interest. On the other hand, the tiltable mirror should be relatively light to increase its resonant frequency to avoid switching transients. Furthermore, the torsion beams should be made flexible so that a small actuator voltage can produce a large mirror tilt, which either simplifies the electronics or the optics or enables coupling between a larger number of fibers. Tilts of ±4° about the center orientation are desired. Long torsion bars are difficult to fabricate and result in fragile structures. Further, the typical MEMS torsion beam is etched from crystalline silicon. Reducing the cross section of the silicon increases the probability of fracture of the crystalline material. An optical switch fielded in a commercial telecommunications network must be highly reliable, and the large number of mirrors in the array exacerbates the failure problem.

One way to effect electrostatic actuation of the tiltable mirrors places electrodes in the substrate under the mirror and separated from it by a gap to allow the mirror to tilt into the gap. Fabricating such buried electrodes is not a straightforward process.

SUMMARY OF THE INVENTION

In one aspect of the invention, an array of tiltable MEMS elements are formed in first and second substrates and bonded to a third substrate. The tiltable plates are formed in a first substrate but the handle layer is not removed yet. Cavities are formed in the second substrate in correspondence to the tiltable elements but the handle layer is not removed yet. The first and second substrates are bonded together, and the handle layer of the second substrate is removed. The bonded substrates or chips diced from them are bonded to a third substrate. The handle layer of the first substrate is removed, thereby releasing the mirrors, after bonding to the third substrate.

The MEMS elements are advantageously tiltable by electrostatic actuators associated with each mirror, for example, two or more electrode pairs spaced about torsion beams about which the mirror plate is tilted. The mirror plates may form one common counter electrode while the third substrate may include individual electrodes in opposition to the counter electrode of the tiltable plates According to a feature of another invention with which the present invention may be practiced, the third substrate may include multiple layers of electrical connection lines and may also support one or more electronic integrated circuits controlling and driving the arrays of mirrors.

The first and second substrates may be formed from silicon over insulator (SOI) wafers. The mirrors and torsion bars may be formed from the silicon layer of the first SOI wafer, and the cavity formed primarily in the silicon layer of the second SOI wafer.

The invention also includes the structure that is produced by this or other methods.

DETAILED DESCRIPTION OF THE PREFERRED EMBODIMENTS

Figure 2:
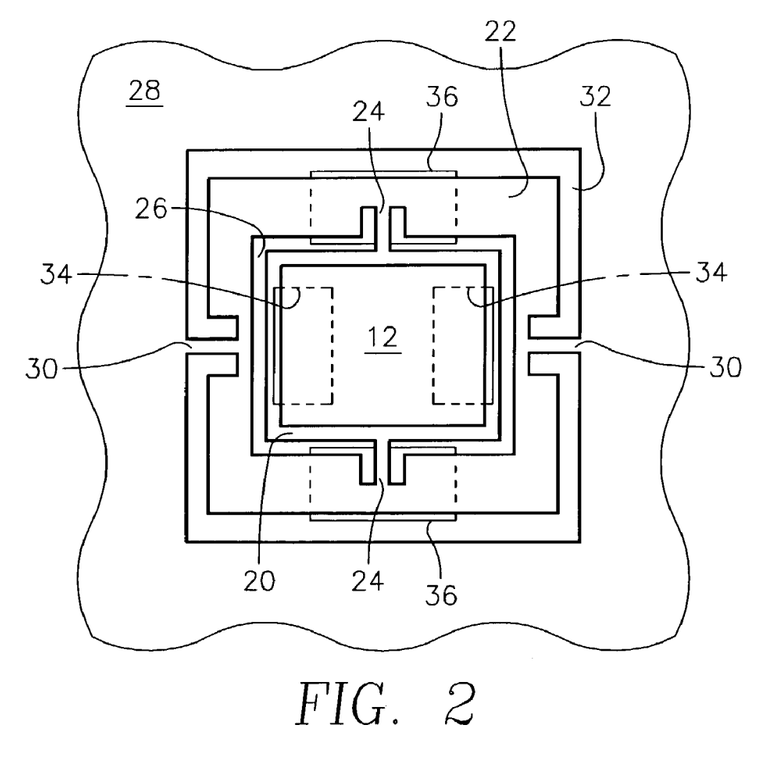
FIG. 2 is a plan view of a single mirror in the array.

One embodiment of the invention incorporates an electrostatically actuated gimbal structure, illustrated in plan view in FIG. 2, for controllably tilting each mirror 12 about two orthogonal axes. The mirror 12 is formed of a metallic coating over a mirror plate 20 supported by a surrounding frame 22 through a first pair of opposed torsion beams 24 extending along a first axis. A horizontal gap 26 is formed between the mirror plate 20 and the frame 22. The frame 22 in turn is supported by a surrounding support structure 28 through a second pair of opposed torsion beams 30 extending along a second axis orthogonal to the first axis. Another horizontal gap 32 is formed between the frame 22 and the support structure 28. The support structure 28 is part of the substrate 14 in which is formed an array of such mirrors. In this embodiment, the mirror plate 20, frame 22, and torsion bars 24, 30 are formed in a thin crystalline silicon layer also extending over the fixed support structure 28, but they are released from the underlying substrate in a microelectronic etching step.

One or more etching steps during the fabrication forms a cavity having a vertical gap formed in the substrate 14 underneath the mirror plate 20 and the frame 22. A first pair of electrodes 34 is formed in the substrate 14 and positioned on either side of the first axis beneath opposite sides of the mirror plate 20. A second pair of electrodes 36 is formed in the substrate and positioned on either side of the second axis beneath opposite sides of the frame 22. The vertical gap separates the electrodes 34, 36 from the mirror plate 20 and the frame 22 which are held at a common potential and form a common counter electrode to the electrodes 34, 36 although the mirror plate 20 and the frame are separately tiltable. The force between any electrode 34, 36 and the portion of the counter electrode it faces increases with the magnitude of the voltage between the electrode 34, 36 and the counter electrode. The pairing of the electrodes 34, 36 allows the net torque exerted on the tiltable elements 20, 22 to depend upon the difference of voltages applied to the electrode pair.

The cavity must be moderately deep to allow the mirror plate 20 and frame 22 to tilt the relatively large angles desired. Physically, the vertical gap distance d and the maximum tilt angle θ are related by $$d = p_l \tan \theta,$$

where $p_l$ is the half length of the mirror plate or frame. On the other hand, a large vertical gap decreases the electrostatic force exerted between the electrodes.

A spring-loaded electrode in an electrostatic actuator has a linear response with respect to the square of the applied voltage for small displacements from the zero-force position. However, for large displacements, the force rapidly increases with voltage because the separation between the electrodes is decreasing. However, because of the pull-in condition the electrostatic actuation distance is limited to a fraction of the vertical gap d, the fraction being in the neighborhood of 0.33 to 0.44. The pull-in voltage $V_{pi}$ is also related to the resonant frequency $f_n$ of the tiltable mirror element by $$V_{pi} = 5.72 \; f_n \sqrt{\frac{J}{\varepsilon p_1}\left(\frac{2d}{p_w}\right)^3},$$

where J is the mass moment of inertia of the tiltable element about its torsion spring, $P_w$ is the width of the tiltable mirror element, and $\in$ is the permittivity of air. Thus, the pull-in voltage $V_{pi}$ is linear with resonant frequency $f_n$, and the resonant frequency is limited by the available actuation voltage.

On one hand, large mirrors are desired to reflect a larger fraction of the optical field and to ease alignment. Further, wider mirrors will reduce the required actuation voltage. On the other hand, long mirrors increase the required gap, and larger mirrors occupy more chip area. A good compromise for a maximum tilt of ±4° is found in a mirror half length $p_l$ of 175 μm and a gap d of 12.2 μm. Generally, the maximum tilt angle of the frame need not be so large.

Several methods are available to fabricate the vertical structure associated with the planar structure generally illustrated in FIG. 2, but the described method has several advantages. The vertical structure will be illustrated with simplified cross-sectional views which show the mirror but not the frame. The mirror torsion beams, generally unillustrated, extend perpendicularly to the plane of the illustration.

Although there are some applications requiring a mirror tiltable only about a single axis, the design illustrated in the following drawings can be easily extended to one having a tiltable frame intermediate the mirror and the support structure, as in FIGS. 1 and 2. The described method involves a multi-layer structure formed by bonding together several levels, some of them preformed with structure or electronic circuitry. The bonding may be performed on the wafer level or on the die level.

A first embodiment of the method of forming joins together two silicon-on-insulator (SOI) wafers, dices the joined wafers into chips, and joins one or more such chip to a substrate which, according to another invention, incorporates one or more electronic integrated circuits, such as application specific integrated circuits (ASICs). In one variation, the substrate to which the bonded SOI chip is joined is the ASIC itself. The two SOI wafers will be referred to as the mirror and cavity wafers since the two structures are principally formed in the respective wafers.

Figure 3:
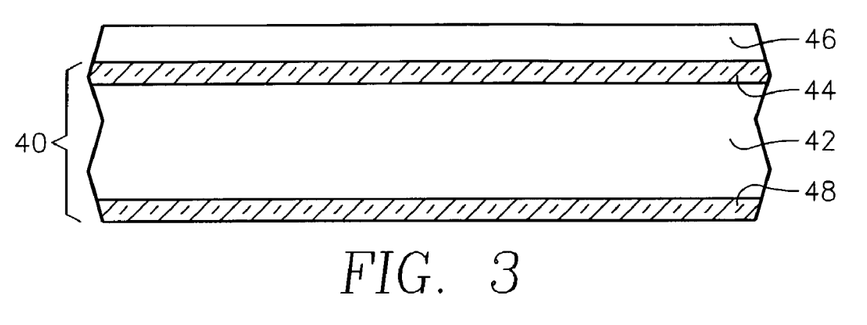
FIGS. 3 through 12 are cross-sectional view of structures being progressively fabricated from three substrates to form a MEMS optical switch incorporating the MEMS micro mirror array and the controlling and driving electronics.
Figure 4:
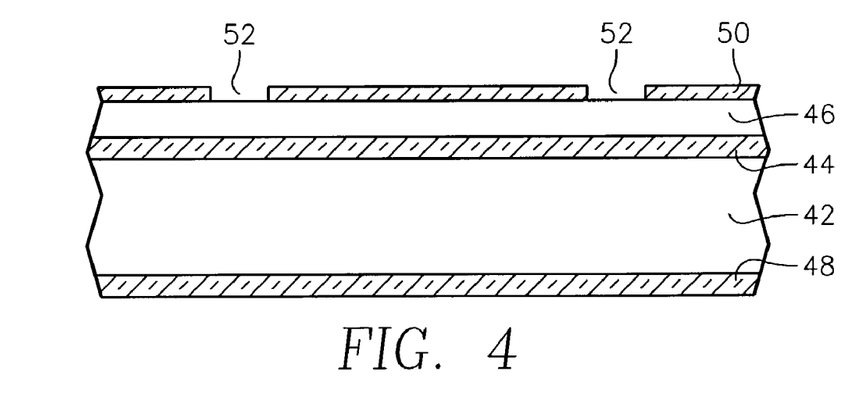

A mirror SOI wafer 40 illustrated in the cross-sectional view of FIG. 3 includes a silicon substrate 42, typically a single crystal silicon wafer, a buried silicon dioxide ($SiO_2$) or oxide layer 44, grown on the silicon substrate, for example, by oxidation or chemical vapor deposition, and a thin polycrystalline $p^+$ silicon layer 46 grown on the oxide layer 44 by methods well known in the art. The highly doped silicon layer 46 can be used as an electrical conductor. The crystalline silicon layer 46 will be referred to as the device layer 46. An optional protective oxide layer 48 may be grown on the back of the silicon wafer 42. Often in SOI technology, the silicon substrate serves as a sacrificial handle layer and is etched away. SOI wafers are commercially available with controllable thickness of the oxide layer 44 and silicon layer 46. Exemplary thicknesses are 380 μm for the silicon substrate 42, 1 μm for the buried oxide layer 44, 10 μm for the device layer 46, and 1 μm for the protective oxide layer 48.

Although not required, an oxide hard mask is useful for defining the mirror and frame structure. Accordingly, a mask oxide layer 50 is formed, for example, by dry oxidation of the underlying silicon layer 46 to a thickness of 0.1 μm, and is lithographically patterned to form apertures 52 corresponding to the horizontal gaps, in the simplified illustration the gap surrounding the mirror plate. However, the portion overlying the intended torsion beams are not included within the apertures 52. As illustrated in the cross-sectional view of FIG. 5, reactive ion etching applied, for example, using a bromine-based plasma, to the areas exposed by the hard mask aperture 52 to etch a gap 54 in the silicon device layer 50 which separates a mirror plate 56 from a surrounding silicon support portion 58 of the support structure. However, torsion beams 60 extending perpendicularly to the illustration are left to connect the mirror plate 56 to the silicon support portion 58. An optional clean dry oxidation is performed to form, as illustrated in the cross-sectional view of FIG. 6, oxide gap sidewalls 64 having a thickness of example of 0.1 μm, so that the silicon device layer 56 is completely encapsulated by oxide and different levels of the eventual structure are electrically isolated from each other. This finishes the separate fabrication of a completed mirror wafer 40'.

Figure 5:
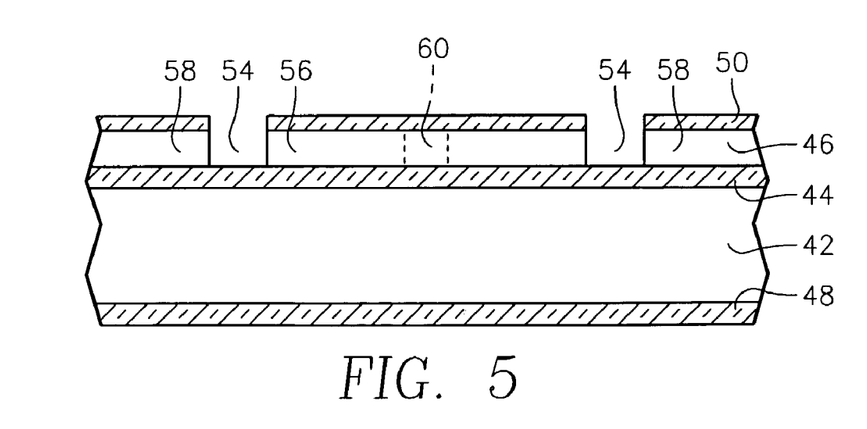
Figure 6:
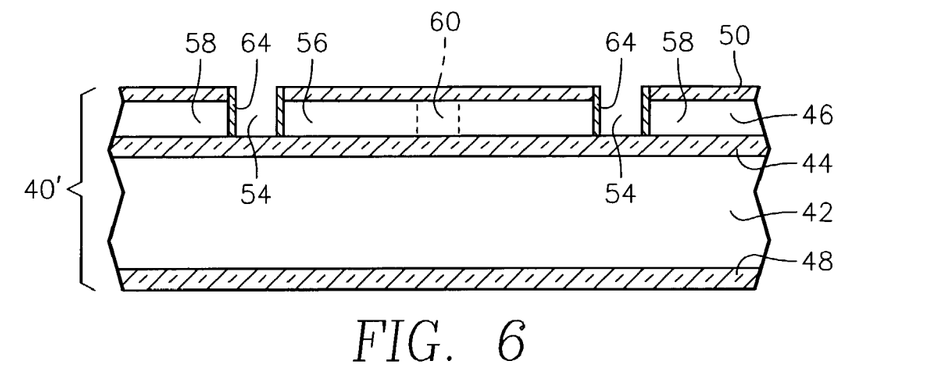

If the oxide encapsulation produced by the oxide hard mask layer 50 and the oxide sidewalls 64 is not considered necessary, the gaps 54 can be photolithographically formed with a photoresist mask and without the oxidation represented in FIGS. 5 and 6.

A cavity SOI wafer 70, illustrated in the cross-sectional view of FIG. 6, is prepared having a silicon handle layer 72, a buried oxide layer 74, and a crystalline silicon device layer 76. The thickness of the device layer 76 mostly determines the depth of the vertical gap beneath the MEMS mirror so an exemplary thickness is 100 μm. Similarly to the mirror SOI wafer, the silicon handle layer 72 may have a thickness of 380 μm, and the buried oxide layer 74 may have a thickness of 1 μm. A fusion oxide layer 78 may be oxidized from the silicon device layer 76 to a thickness of, for example, 0.6 μm to aid in the following fusion step.

Figure 7:
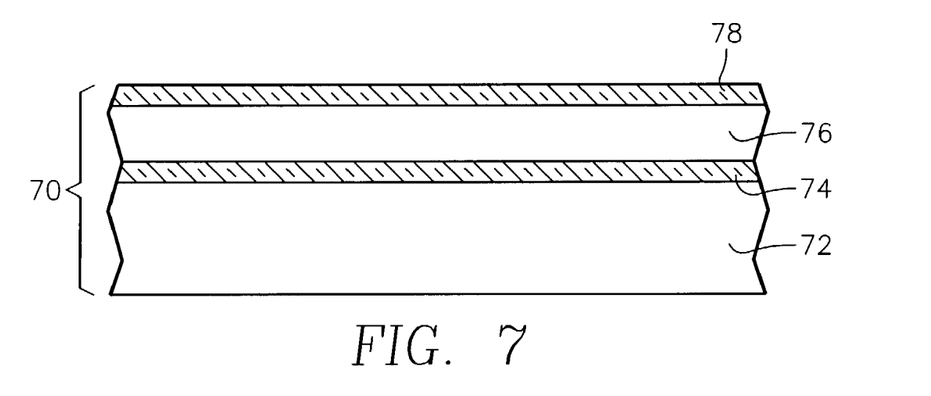
Figure 8:
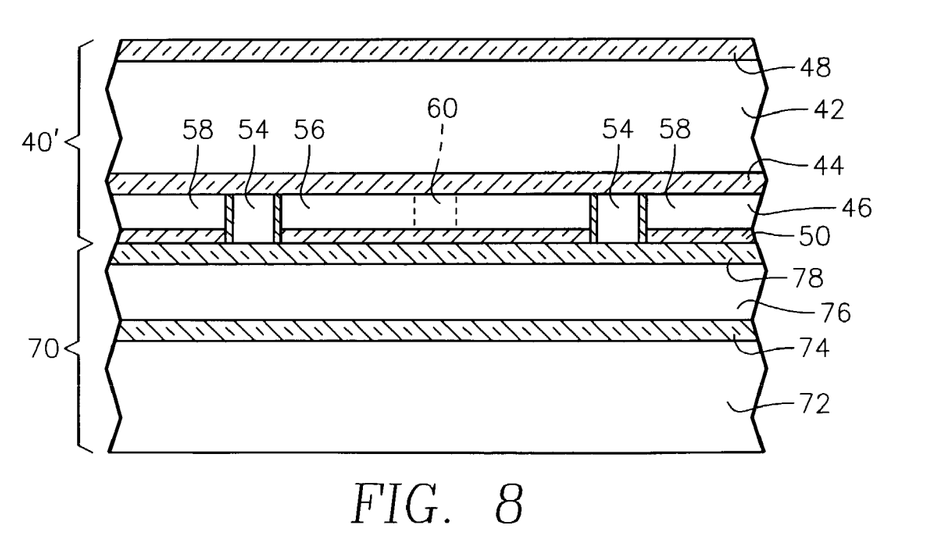

As illustrated in the cross-sectional view of FIG. 8, the two SOI wafers 40, 70 are bonded together. The completed mirror wafer 40 of FIG. 6 is inverted relative to the cavity wafer 70 of FIG. 7 and placed on it so that the buried oxide layer 44 of the completed SOI wafer 40 contacts the fusion oxide layer 78 of the cavity SOI wafer 70, and the gaps 54 are embedded and facing the interface. The two wafers 40, 70 are bonded together by a fusion bonding process. Once the substrates 40', 70 are in contact, they are held together by an attractive atomic force, i.e. van der Waal force, which is strong enough to allow the joined substrates to be handled. The joined substrates 40', 70 are then placed in a furnace and annealed at high temperature, after which a solid bond is formed between the substrates.

Figure 9:
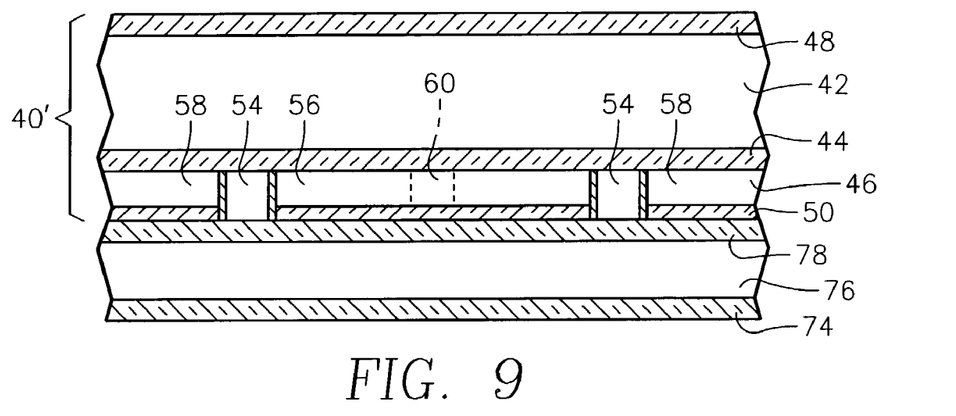

After wafer bonding, the silicon handle layer 72 of the cavity SOI wafer 70 is removed, as illustrated in the cross-sectional view of FIG. 9, by a wet process that is selective to oxide. A photo mask is applied to the cavity buried oxide layer 74, now exposed at the bottom of FIG. 9, with the mask aperture extending under the mirror 56 to the outer periphery of the gap 54 or somewhat beyond. If a frame were being simultaneously formed, the mask aperture would extend further outwardly to the outer periphery of the gap between the frame and the support area. A multi-step etch process is then performed to first remove the non-masked portion of the cavity oxide layer 74, as illustrated in the cross-sectional view of FIG. 10, and then to remove the non-masked device layer 76 and two oxide layers 78, 50 and the oxide sidewalls 64 without significantly removing the buried oxide layer 44 of the mirror SOL wafer 40'. However, the unmasked portion of the buried oxide layer 44 may optionally be removed at this time since the mirror plate 56 remains supported on the handle layer 42. A vertical gap 80 is formed beneath the exposed mirror plate 56, but the mirror plate 56 and torsion beams 60 remain joined to and supported by the fairly massive handle layer 42 of the mirror 501 wafer 40'. Although techniques are available to remove the handle layer 42 and release the mirror plate 56 and torsion beams 60 prior to attachment to the carrier having the opposed electrodes, the handle layer 42 eases attachment.

With the completion of the above steps, the fabrication of the structure within the MEMS wafer is for the most part completed although some layers need to be later removed. The MEMS wafer, similarly to semiconductor integrated circuits, is typically fabricated with a large number of identical chips, each chip containing one array of MEMS mirrors. At this point, the MEMS wafer is diced to form separate chips or dies which are thereafter individually processed.

Figure 10:
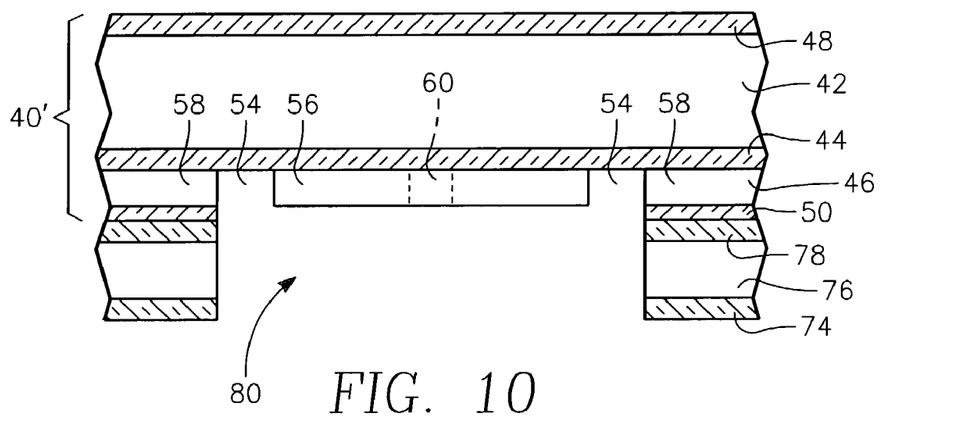
Figure 11:
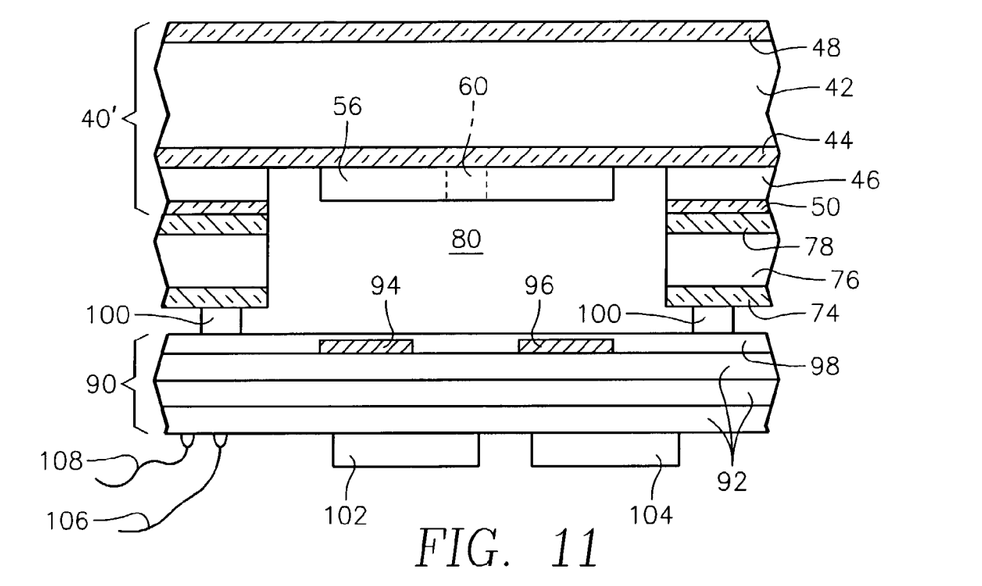

The related concurrently filed application is directed to the carrier and its bonding to a MEMS structure, such as that of FIG. 10. That process and resultant structure of the invention of the related application are separable from the present invention but may be used therewith. The discussion of the relation application will be briefly summarized here. The carrier may be a ceramic multi-chip module (MCM)

carrier 90 illustrated in the cross-sectional view of FIG. 11 including multiple wiring layers 92 bonded together in a cofiring process for all the layers 92 of the module 90. Each wiring layer 92 is a free standing green form of ceramic particles and solvents. Each layer 92 of green form is separately processed with metallization to form both a horizontal wiring pattern and vertical vias extending through that level 92. The layers 92 are laid in a stack with the wiring patterns of the different layers aligned according to the total wiring plan. The stack is then fired in a sintering process to form a ceramic module with the internal wiring pattern. Top contact pads and electrodes 94, 96 intended to form capacitor plates of the MEMS electrostatic actuators are deposited on the top surface, and the electrodes 94, 96 are preferably covered by a protective oxide layer 98.

The MEMS chip formed by cleaving or sawing the MEMS wafer of FIG. 10 is aligned to the electrode structure of the carrier 90 and is permanently bonded to it through localized bonding pads 100, for example, by using solder bump bonding. The design may include multiple MEMS chips bonded to the carrier. Electronic integrated circuits 102, 104, typically formed of application specific integrated circuits (ASICs) are bonded to the MCM carrier 90 on the side opposite the MEMS chip in alignment to contact pads on that side. The ASICs 102, 104 provide the electronic control and drive signals for the electrical actuators associated with array of mirrors in the MEMS chip through the wiring patterns of the MCM module 90. In one design, the MEMS chip includes 960 mirrors each with 4 electrostatic actuators. Only a few relatively small ASICs 102, 104 are needed for such a large number of actuators with the MCM carrier 90 distributing the signals over the entire large MEMS chip. Advantageously, one ASIC 102 may contain the low-voltage but relatively complex control circuitry while another ASIC 104 may contain the high-voltage but relatively simple drive circuitry so that the different ASICs are fabricated according to processes more suited to their operation. Electrostatic drive signals are generally greater than 50V and may be 200V or higher awhile digital control signals are generally no more than 5V and may be 2.3V and lower. As a result, the high-voltage ASICs generally output signals having voltages at least ten times greater than do the low-voltage ASICs. A few external wires 106, 108 may be bonded to the ASIC side of the MCM carrier and provide both control signals and power to the ASICs 102, 104 through wiring patterned in the MCM carrier 90. Note that the control circuitry described by Garverick et al. requires only a single electrical connection to the conductive p$^+$silicon device layer 46 at the top of the entire MEMS chip, an alternating common node power signal. One of the external wires 106, 108 may be used for this purpose. As a result, there is no further electrical connection required between the ASICs 102, 104 and the MEMS chip beyond the drive signals delivered to the electrodes 94, 96 in the MEMS side of the MCM carrier 90.

Figure 12:
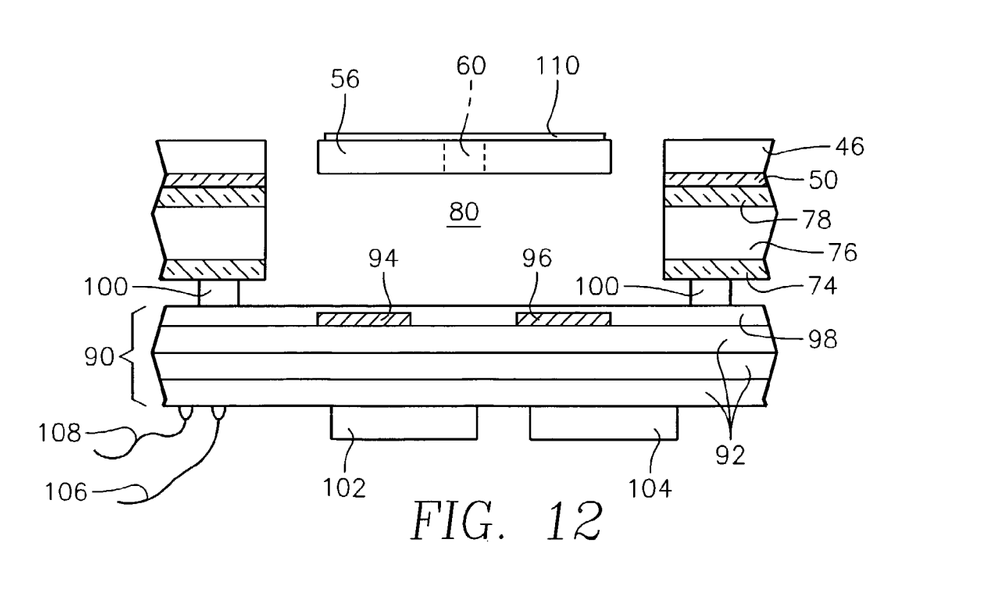

After their bonding, the MEMS mirror array is solidly supported by the MCM carrier. The protective oxide layer 48, the silicon handle layer 42, and the buried oxide layer 44 in the cavity wafer part 40 on the top side of the bonded structure are etched away to release the mirrors plate 56 and torsion beams 60 to produce the structure of FIG. 12. A mirror 110 is formed by coating the top surface of the released mirror plate 56 with a highly reflective metal such as silver or gold. Because the fragile mirror plate 56 have been released, shadow masking is used to pattern the sputter deposition in which special fixturing is combined with a sputtering screen that has openings only in the areas of the relatively large mirror plates 56. The shadow mask may be keyed to indicia in the carrier 90. The wiring to the heavily doped device layer 46 may be done at this point. The ASIC bonding may be delayed till after the removal of the handle layer 42 and the plating of the mirror 110.

Although the MCM carrier offers many advantages, other types of carriers may be used. The ASIC chip itself or other large silicon chip can be used as a carrier. Other substrates such as printed circuit boards, particularly multi-level ones, may be used to support the MEMS structure and, in one aspect of the invention, to provide one of the capacitor plates in the electrostatic actuator. The ASICs may be bonded to the same side of the carrier as the MEMS chip.

Although 1- or 2-axis arrays of tiltable mirrors have been described for practicing the invention, the invention is not so limited. Other types of MEMS elements may benefit from the invention, particularly those relying upon fragile movable elements partial release from the substrate supporting them. The invention is not limited to tiltable mirrors but may include other deformable MEMS members, especially when an electrode is included in the deformable member, either for electrostatic actuation or for capacitively sensing the position of the deformable element.

The invention is particularly applicable to electrostatically actuated MEMS elements in which the driving electrode is embedded in the carrier. However, many advantage of the invention may be enjoyed by other type of MEMS actuators, such as inductively actuated MEMS elements.

The invention economically provides, among other advantages, a high-performance capacitively coupled array of MEMS elements using readily available fabrication techniques. In the case of an optical switch, an array of mirrors which are electrostatically tiltable in two dimension provide a highly efficient optical switch for a large number of optical signals.

The invention claimed is:

1. An electrostatic MEMS element, comprising:
    a deformable member formed in a first substrate and including a first electrode, a frame and a mirror, wherein said frame and said mirror are separately deformable;
    a second substrate bonded to said first substrate and having a cavity extending therethrough facing said deformable element and said first electrode;
    a third substrate comprising a multi-chip module carrier including multiple wiring levels bonded to said second substrate and including a second electrode actuating deformation of said mirror and a third electrode actuating deformation of said frame, wherein the second and third electrodes are deposited directly on the multi-chip module carrier, and wiring connected to the second and third electrodes passing through the third substrate on a level below the second and third electrodes, said second and third electrodes facing said first electrode across said cavity.

2. The element of claim 1, wherein said first substrate includes two straight torsion beams linearly extending along an axis and supporting said deformable element on said first substrate such that said deformable element is rotatable about said axis.

3. The element of claim 1, wherein said first and second substrates are formed respectively of first and second SOI substrates.

4. The element of claim 2, wherein said first electrode extends across said axis and wherein said third substrate includes a fourth electrode arranged on an opposite side of said axis from said second electrode.

5. The element of claim 1, wherein said deformable element includes a mirror coated on a side thereof opposite said cavity.

6. An array of said MEMS elements as recited in claim 1 including a plurality of respective deformable members, cavities, first electrodes, second electrodes, and third electrodes formed in said first, second, and third substrates.

7. An array of MEMS elements comprising:
a plurality of tiltable members each including a frame and a mirror that are separately tiltable and at least one pair of torsion beams formed by gaps extending through a first silicon layer in a first substrate;
a plurality of cavities formed in a second silicon layer in a second substrate;
a plurality of third substrates each comprising a multi-chip module carrier including multiple wiring levels to which first and second substrates are bonded with said cavities aligned to said tiltable members; and
a plurality of electrodes for actuating the plurality of tiltable members, wherein the plurality of electrodes are deposited directly on the multi-chip module carriers.

8. An optical switch including an M×N array of electrostatically actuated mirrors, comprising:
a first substrate including an M×N array of tiltable mirrors, where each mirror includes a separately tiltable frame;
a second substrate bonded to said first substrate and including an M×N array of cavities in association with said tiltable mirrors; and
a third substrate comprising a multi-chip module carrier including multiple wiring levels bonded to said second substrate and including at least M×N second electrodes in opposition to said tiltable mirrors but not said frames across said cavities and M×N third electrodes in opposition to said frames and not said tiltable mirrors across said cavities, said second and third electrodes being connected to the multiple wiring levels, wherein the second and third electrodes are deposited directly on the multi-chip module carrier.

9. The switch of claim 8, wherein said first and second substrates are formed from SOI wafers.

10. The switch of claim 8, wherein said mirrors are formed from a heavily doped silicon layer.

11. The switch of claim 8, wherein said first substrate includes a first electrode common to all of said mirrors and opposed to all of said second and third electrodes.

12. The switch of claim 11, wherein each of said mirrors are tiltable about two respective orthogonal axes.

13. The switch of claim 12, four of said first electrodes are associated with each of said mirrors and are arranged in pairs across said two orthogonal axes.

14. The element of claim 1, wherein said first electrode has a first voltage, said second electrode has a second voltage, and said third electrode has a third voltage, and wherein deformation of said deformable member is a function of a first difference between said first voltage and said second voltage and a second difference between said first voltage and said third voltage.

15. The element of claim 1, wherein said deformation of said deformable member defines the depth of said cavity.

16. An electrostatic MEMS element, comprising:
a deformable layer formed in a first substrate and including a first electrode, a frame, a plate, a pair of first twistable members to twistably connect said first substrate and said frame and allow tilting therebetween about a first axis, and a pair of second twistable members twistably connecting said frame and said plate to allow tilting therebetween about a second axis inclined with respect to said first axis;
a second substrate bonded to said first substrate and having a cavity extending therethrough facing said deformable layer and said first electrode;
a third substrate comprising a multi-chip module carrier including multiple wiring levels bonded to said second substrate and including a second electrode facing said first electrode across said cavity and actuating tilting of said plate but not said frame and a third electrode facing said first electrode across said cavity and actuating tilting of said frame, wherein the second and third electrodes are deposited directly on the multi-chip module carrier.

17. The MEMS element of claim 16, wherein said first twistable members are straight torsion beams extending along said first axis and said second twistable members are straight torsion beams extending along said second axis.

18. The MEMS element of claim 17, wherein said first and second axes are perpendicular to each other.

19. The MIEMS element of claim 16, wherein said plate is formed with a mirror surface on a side opposite said cavity.

20. The element of claim 1, wherein said third substrate comprises a ceramic carrier having wiring extending therethrough from the first side to the second side thereof.

21. The switch of claim 8, further comprising at least one electronic integrated circuit fixed to a side of the multi-chip module carrier opposite the second substrate and connected to the multiple wiring levels.

22. An electrostatic MEMS element, comprising:
a deformable member formed in a first substrate and including a first electrode, a frame and a mirror, wherein said frame and said mirror are separately deformable;
a second substrate bonded to said first substrate and having a cavity extending therethrough facing said deformable element and said first electrode;
a third substrate comprising a printed circuit board carrier bonded to said second substrate and a second electrode actuating deformation of said mirror and a third electrode actuating deformation of said frame, wherein the second and third electrodes are deposited on the printed circuit board and wiring connected to the second and third electrodes passing through the third substrate on a level below the second and third electrodes, said second and third electrodes facing said first electrode across said cavity.

23. The element of claim 22, wherein said first substrate includes two straight torsion beams linearly extending along an axis and supporting said deformable element on said first substrate such that said deformable element is rotatable about said axis.

24. The element of claim 22, wherein said first and second substrates are formed respectively of first and second SOI substrates.

25. The element of claim 23, wherein said first electrode extends across said axis and wherein said third substrate includes a fourth electrode arranged on an opposite side of said axis from said second electrode.

26. The element of claim 22, wherein said deformable element includes a mirror coated on a side thereof opposite said cavity.

* * * * *